United States Patent
Wong et al.

(10) Patent No.: US 6,288,922 B1
(45) Date of Patent: Sep. 11, 2001

(54) STRUCTURE AND METHOD OF AN ENCODED TERNARY CONTENT ADDRESSABLE MEMORY (CAM) CELL FOR LOW-POWER COMPARE OPERATION

(75) Inventors: Hing Wong, Los Altos; Subramani Kengeri, San Jose, both of CA (US)

(73) Assignee: Silicon Access Networks, Inc., San Jose, CA (US)

( * ) Notice: Subject to any disclaimer, the term of this patent is extended or adjusted under 35 U.S.C. 154(b) by 0 days.

(21) Appl. No.: 09/637,124

(22) Filed: Aug. 11, 2000

(51) Int. Cl.[7] .................................................. G11C 15/00
(52) U.S. Cl. ........................ 365/49; 365/189.07; 365/168
(58) Field of Search ................................... 365/49, 189.07, 365/168

(56) References Cited

U.S. PATENT DOCUMENTS

| | | | |
|---|---|---|---|
| 6,081,440 | * 6/2000 | Washburn et al. | 365/49 |
| 6,101,115 | * 8/2000 | Ross | 365/49 |
| 6,108,227 | * 8/2000 | Voelkel | 365/49 |
| 6,137,707 | * 10/2000 | Srinivasan et al. | 365/49 |
| 6,169,685 | * 1/2001 | Gandini et al. | 365/49 |

* cited by examiner

*Primary Examiner*—Huan Hoang
(74) *Attorney, Agent, or Firm*—Fernandez & Associates, LLP

(57) ABSTRACT

The invention discloses a low-power ternary CAM by utilizing four encoded comparand datalines, C0, C1, C2, and C3 in a twin ternary cell. The twin ternary cell is a composite of two ternary CAM bits. The two binary CAM bits are coded so that only one of four comparand datalines is toggled during a compare operation. The encoded data is stored and used for comparison. In one embodiment, the four possible states for the 2 bit comparands are coded as 0001, 0010, 0100, and 1000.

17 Claims, 6 Drawing Sheets

STRUCTURE AND METHOD OF AN ENCODED TERNARY CONTENT ADDRESSABLE MEMORY (CAM) CELL FOR LOW-POWER COMPARE OPERATION

BACKGROUND INFORMATION

1. Field of the Invention

The present invention relates to the field of integrated circuits, and particularly to a content addressable memory (CAM).

2. Description of Related Art

Networking companies are scrambling in a race to design and develop high performance network processing products for the terabit router market while reducing the cost to implement 10 giga-bits per second/OC192 and above optical carrier network interfaces. Terabit routers demand a fatter throughput of data packets for examining an incoming packet, retrieves a next hop location, and transfers the packet to destination. Among various designs and memory architectures, a ternary CAM is a popular choice due to its fast processing speed for parallel address matching and rule-based classification.

A ternary CAM cell is capable of storing information in three different logic states, a binary "0" state, a binary "1" state, and an "X" or "don't care" state. One characteristic of a CAM is that the entire chip is being accessed every cycle for a look-up, which consumes a large amount of power. Conversely, most other types of memories access only a specific address, which in turn consumes a relative small amount of power. But in a CAM, the entire chip has to be checked in parallel. Electrical power in a CAM is generally consumed from two sources, a set of compare lines and a set of match lines. Compare and matching lines are the ones that are actually switching in a CAM.

FIG. 1 illustrates a conventional ternary CAM cell 5 that employs a pair of data storage and comparator groups 11 and 12 and a conventional ternary CAM cell 10 that employs a pair of data storage and comparator groups 13 and 14. If data is stored in data storage 15, a compliment data is stored in data storage 19. Transistors $\overline{A}$ 16, A 20, B 17, and $\overline{B}$ 21 form an exclusive OR (XOR) function of $\overline{A}$ B and A$\overline{B}$. In combination, the first pair of data storage and comparator groups 11 and 12 is used to code one bit. When data is to be stored, the data is sent to data storage 15, and a complimentary data is being stored in data storage 19.

During a compare operation, data storage and comparator group 11 is used for comparison with true comparand dataline C0 18, and data storage and comparator group 12 is used for comparison with the compliment value of the true comparand dataline $\overline{C0}$ 22. During a non-compare operation, comparand datalines C0 18 and $\overline{C0}$ 22 are both grounded to zero. For operation in a NMOS compare circuit, one of the comparand datalines C0 18 or $\overline{C0}$ 22 must be in a high-voltage state, while the other comparand dataline is in a low-voltage ,tate. The high-voltage dataline is the one that is activated for performing a compare operation. As a result, one-half of the datalines in the CAM cell region is toggled for each compare operation. Given the large amount of parallel compare operations in a CAM cell, the total electrical current consumed by comparand datalines represent a significant portion in a CAM.

Similar operations apply to data storage and comparator group 13 including a comparand dataline C1 26 that couples to a transistor B 25, a transistor $\overline{A}$, and a data storage 23, and data storage and comparator group 14 including a com-parand dataline $\overline{C1}$ 30 that couples to a transistor $\overline{B}$ 29, a transistor A 28, and a data storage 27. The raw data is stored and the raw data is compared. A miss is detected if a match line 31 is pulled low through one of the four CAM cells.

FIG. 2 is a time diagram depicting conventional ternary CAM cell 10 with two datalines C0 18 and C1 26, with corresponding compliments of comparand datalines $\overline{C0}$ 22 and $\overline{C1}$ 30. For every cycle, both the comparand datalines C0 or $\overline{C0}$, and C1 or $\overline{C1}$, may switch up for evaluation and reset for precharge. As a result, there are four switching operations in two cycles, which consumes a significant amount of power from aCAM.

Accordingly, it is desirable to have a CAM circuit and method that reduces the number of switchings on a compare line, and thus effectively reducing the amount of power consumed.

SUMMARY OF THE INVENTION

The invention discloses a low-power ternary CAM by utilizing four encoded comparand datalines, C0, C1, C2, and C3 in a twin ternary cell. The twin ternary cell is a composite of two ternary CAM bits. The two binary CAM bits are coded so that only one of the four comparand datalines is toggled during a compare operation. The encoded data is stored and used for comparison. In one embodiment, the four possible states for the 2-bit comparands are coded as 0001, 0010, 0100, and 1000.

Advantageously, the invention reduces power consumptions in a CAM by avoiding the storing and comparing of raw data. Moreover, the total number of switchings during a compare operation is significantly reduced, thereby resulting in a 50% or more power saving.

DETAILED DESCRIPTION OF PREFERRED EMBODIMENT(S)

Figure 1:
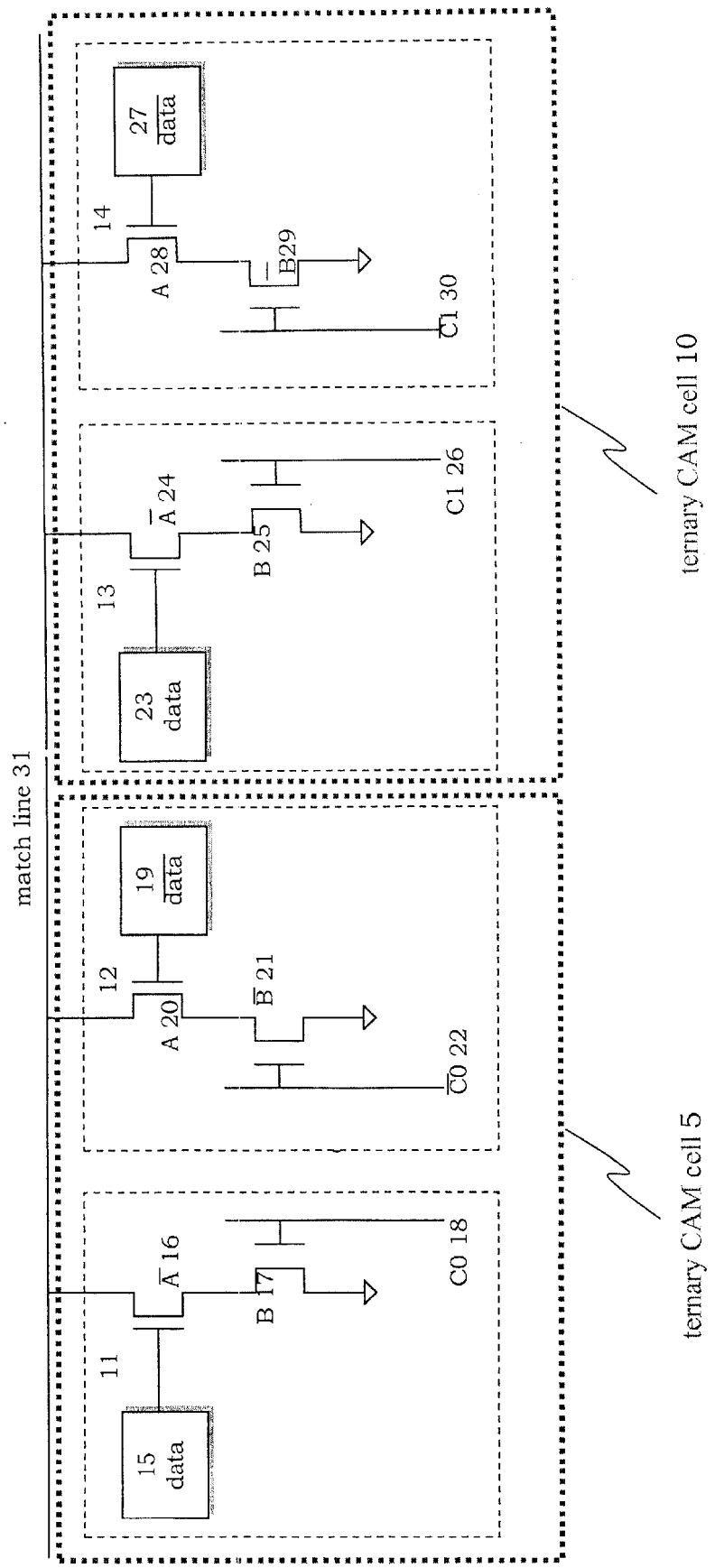
FIG. 1 is prior art circuit diagram illustrating a conventional ternary CAM cell that employs a pair of data storage and comparator groups and a conventional ternary CAM cell that employs a pair of data storage and comparator groups.
Figure 2:
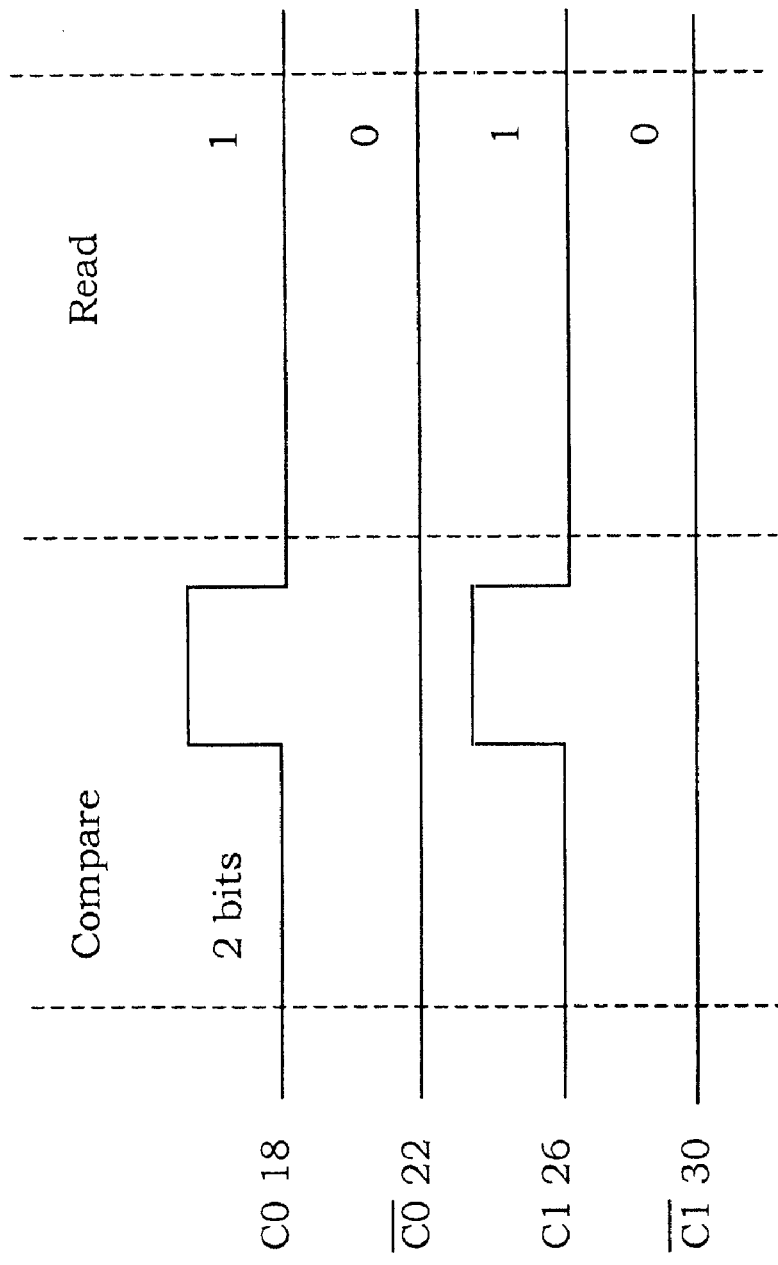
FIG. 2 is a prior art timing diagram illustrating the assertions of comparand datalines in the conventional ternary CAM configuration.
Figure 3:
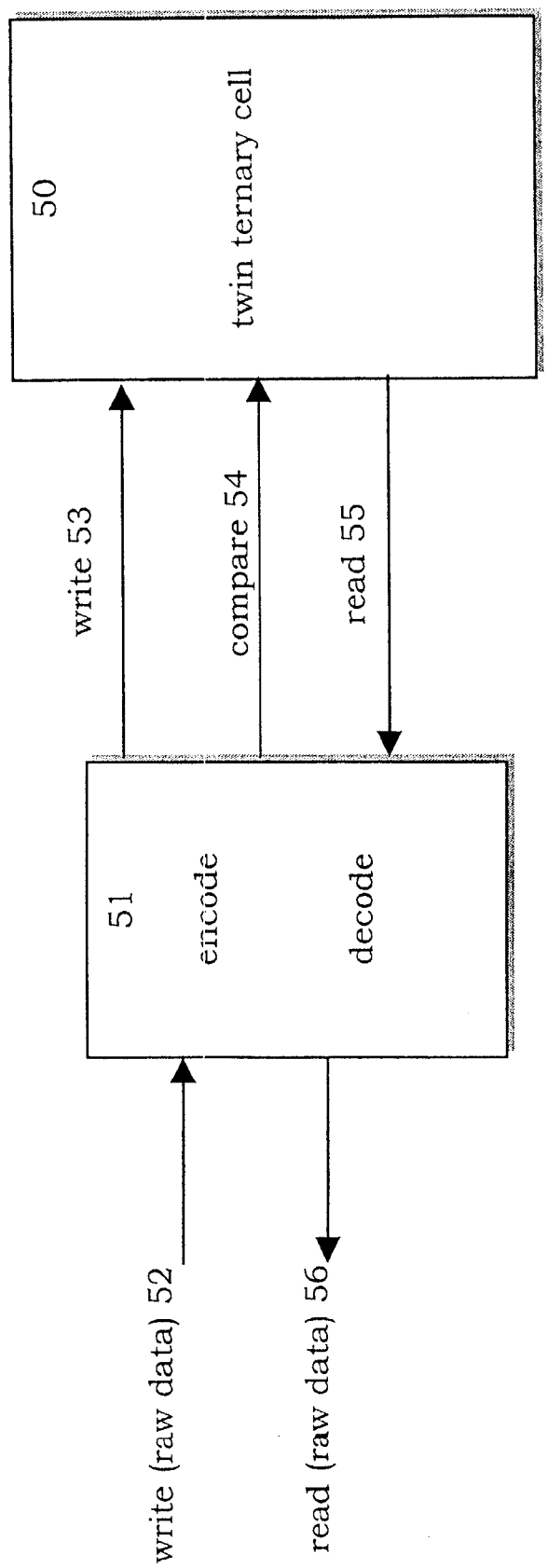
FIG. 3 is a simplified block diagram illustrating a low-power ternary CAM configuration in accordance with the present invention.

FIG. 3 is a simplified block diagram illustrating a low-power ternary CAM configuration. An encoder/decoder 51 is coupled to a twin ternary CAM cell 50 for encoding raw data from a writing operation 52. Encoder/decoder 51 executes a write operation 53 or a compare operation 54 to twin ternary CAM cell 50. When reading from twin ternary CAM cell 52, encoder/decoder 51 decodes the encoded data to generate an output of raw data 56.

Figure 4:
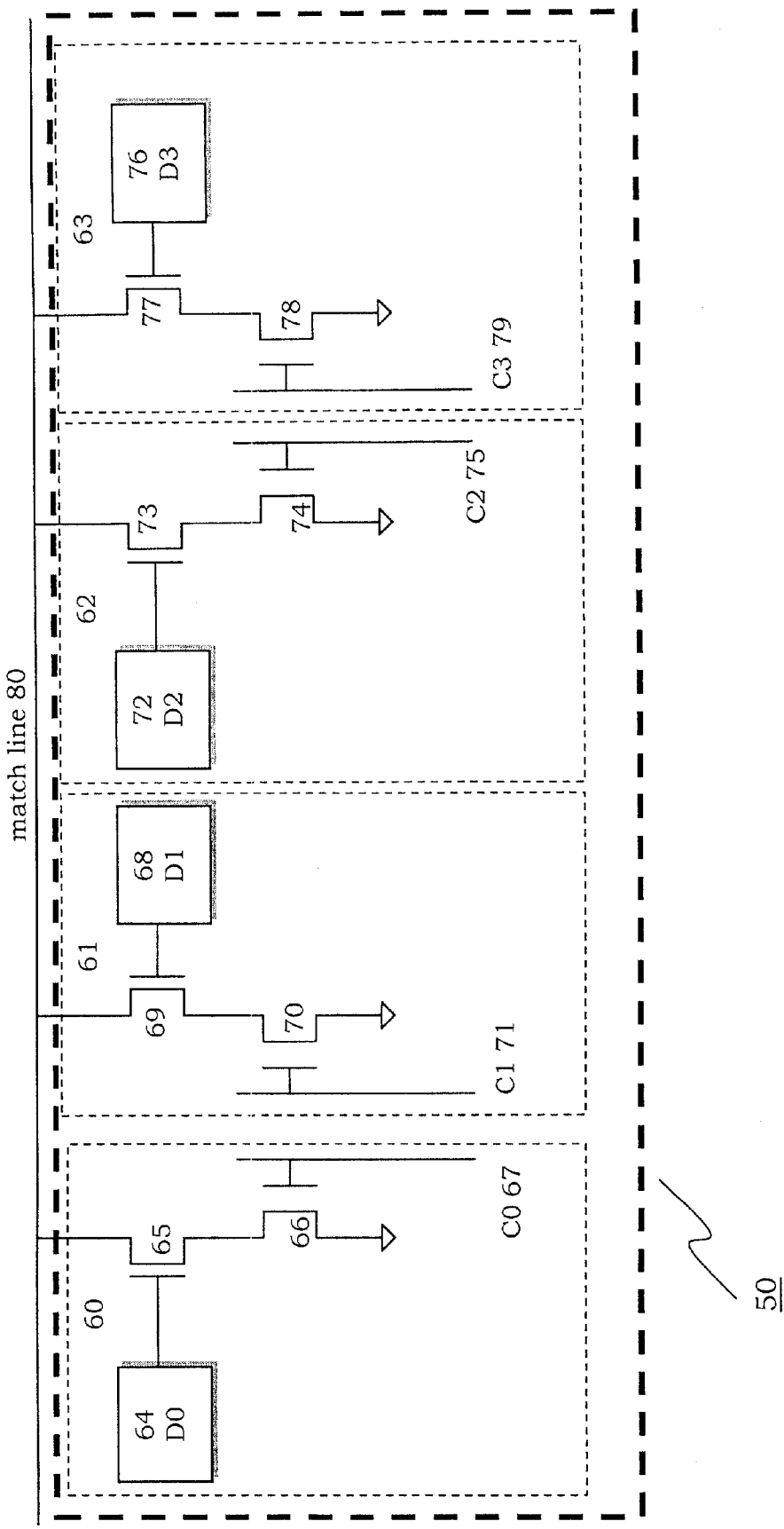
FIG. 4 is a circuit diagram illustrating a low-power ternary CAM configuration with encoded comparand datalines in accordance with the present invention.

FIG. 4 is a circuit diagram illustrating twin ternary CAM cell 50 with encoded comparand datalines, including a first CAM bit 60, a second CAM bit 61, a third CAM bit 62, and a fourth CAM bit 63, interconnected by a match line 80. Each CAM bit is associated with a comparand dataline. Four comparand datalines, C0 67, C1 71, C2 75, and C3 79 are used in twin ternary CAM cell 50.

Twin ternary CAM cell 50 includes four CAM bits, one cell as the combination of CAM bits 60 and 61, and the other cell as the combination of CAM bits 62 and 63. It is apparent to one of ordinary skill in the art that the number of cells in twin ternary CAM cell 50 can be expanded to any number of cells, provided there are no limitations to physical lines.

A state table defines nine ternary states for a two-bit combination, as shown in Table 1. The two ternary bits provide a total of nine binary states: 00, 01, 10, 11, X0, X1, 0X, 1X, and XX. The corresponding stored data states [D3:0] in twin ternary CAM cell 50 are stored as 1110, 1101, 1011, 0111, 1010, 0101, 1100, 0011, and 0000. The four stored data states 1110, 1101, 1011, 0111, are encoded in comparand dataline states C[3:0] as 0001, 0010, 0100, and 1000 respectively. The encoded bits of C[3:0] are storage respectively, in data D0 64, D1 68, D2 72, and D3 76.

TABLE 1

| Stored Data States D[3:0] | Compared Dataline States C[3:0] | Corresponding Ternary States |
| --- | --- | --- |
| 1110 | 0001 | 00 |
| 1101 | 0010 | 01 |
| 1011 | 0100 | 10 |
| 0111 | 1000 | 11 |
| 1010 |  | X0 |
| 0101 |  | X1 |
| 1100 |  | 0X |
| 0011 |  | 1X |
| 0000 |  | XX |

Comparand datalines C0 67, C1 71, C2 75, and C3 77 represent four physical lines that only one of the four comparand datalines switches. Switching in a comparand dataline C0 67, C1 71, C2 75, and C3 79 requires two switches, asserted high and asserted low. Power consumed in each twin ternary CAM cell 50 is thus significanty reduced. For example, a conventional CAM 10 with two complimentary compaerand datalines $\overline{C0}$ 18, C0 22, C1 26, and $\overline{C1}$ 30 require C0 18 or $\overline{C0}$ 22 to switch and $\overline{C1}$ 26 or C1 30 to switch, for a total of four switchings. Therefore, twin ternary CAM cell 50 in this embodiment conserves 50% of power. One of ordinary skill in the art should recognize that the number of comparand datalines can be increased without departing from the spirits in the present invention.

Data in data storage D0 64, D1 68, D2 72, and D3 76 are stored as encoded data. Encoded data are used during compare operations. Therefore, the number of switching is compressed. When the binary value in twin ternary CAM cell 50 corresponds to 00, comparand dataline C0 67 is asserted. If the binary value in twin ternary CAM cell 50 corresponds to 01, comparand dataline C1 71 is asserted. When the binary value in twin ternary CAM cell 50 corresponds to 10, comparand dataline C0 75 is asserted. If the binary value in twin ternary CAM cell 50 corresponds to 11, comparand dataline C1 79 is asserted.

Figure 5:
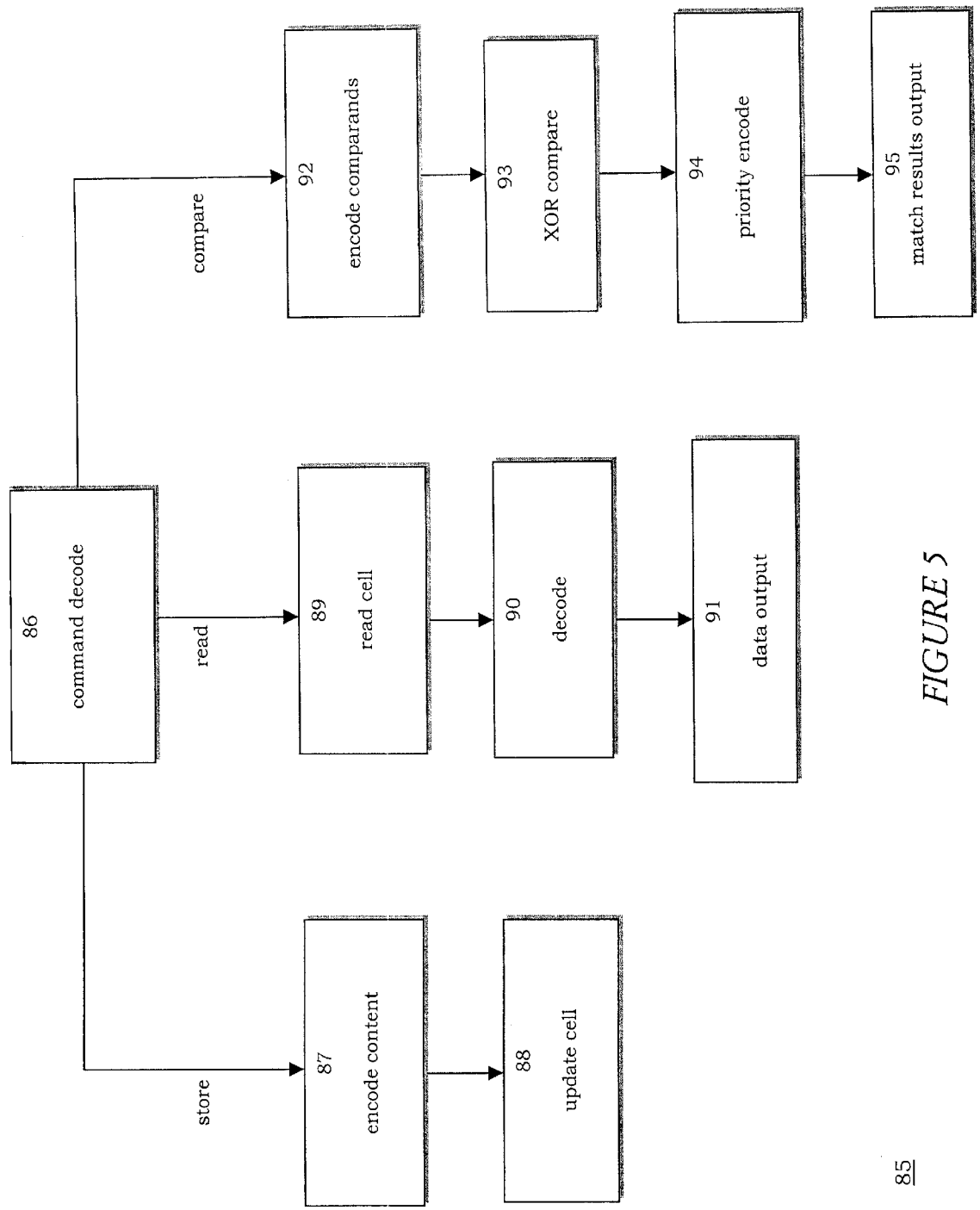
FIG. 5 is a flow diagram illustrating the low-power ternary CAM configuration with encoded comparand datalines in accordance with the present invention.

FIG. 5 is a flow diagram illustrating the low-power ternary CAM configuration with encoded comparand data lines. Twin ternary CAM cell 50 starts 86 with a command decode, and performs one of the three operations: store, read, or compare. For a store operation, encoder/decoder 51 encodes 87 content of received raw data 52 and updates 88 cells in first, second, third, and fourth CAM bits 60, 61, 62, and 63.

For a compare operation, encoder/decoder 51 encodes 92 comparands and performs 93 an XOR comparison. Encoder/decoder 51 then priority encodes 94 the result, and generates 95 match or mismatch output. During a read operation, twin ternary CAM cell 50 reads 89 the encode data, decodes 90 the encoded data, and generates 91 a raw data output.

Figure 6:
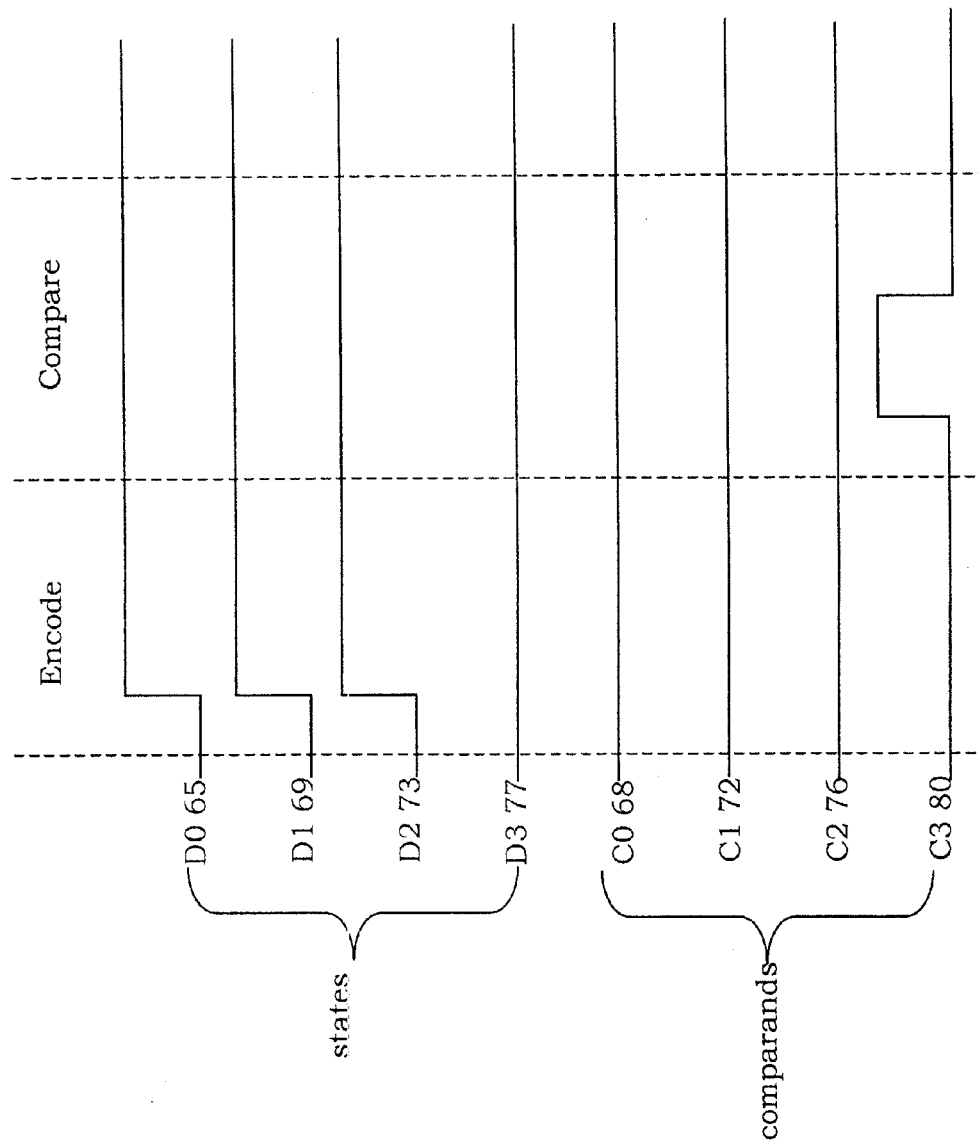
FIG. 6 is a flow diagram illustrating the low-power ternary CAM configuration with encoded comparand datalines in accordance with the present invention.

FIG. 6 is a flow diagram illustrating the low-power ternary CAM configuration with encoded comparand datalines. During encode and compare operations, data in D0 65, D1 69, and D2 73 are asserted high, while data in D3 77 remains unasserted. In this illustration, the stored data state D3 is asserted as "011" for D[3:0], which in turn asserts the comparand dataline C3 80 in binary value of "1000".

The patent disclosure includes copyrightable material. The copyright owner gives permission for facsimile reproduction of material in Patent Office files, but reserves all other copyright rights whatsoever.

The above embodiments are only illustrative of the principles of this invention and are not intended to limit the invention to the particular embodiments described. Although the term "CAM bit" is used in the invention, other similar or equivalent terms may be practiced without departing from the spirit in the present invention, such as CAM unit, partial CAM cell, incomplete CAM cell, and sub-CAM cell. For example, the encoding scheme in Table 1 serves as one embodiment. Other variations of encoding schemes can be used in implementing the present invention. Moreover, although the present invention is described in the context of a ternary CAM, one of ordinary skill in the art should recognize that the encoding scheme in comparand datalines are applicable to a binary CAM. The present invention can be implemented in an embedded CAM, or a standalone CAM for sorting out conditions quickly. The first, second, third, and fourth CAM bits as used in the present invention include memory cells in a DRAM (Dynamic Random Access Memory), SRAM (Static Random Access Memory), E²PROM (Electrical Erasable Programmable Read-Only Memory), EPROM (Erasable Programmable Read-Only Memory), PROM (Programmable Read-Only Memory), ROM (Read-Only Memory), or other types of storage elements, either electrically implemented or through an etched technique. Accordingly, various modifications, adaptations, and combinations of various features of the described embodiments can be practiced without departing from the scope of the invention as set forth in the appended claims.

We claim:

1. A structure, comprising:
   a twin ternary cell, comprising:
   a first, content addressable memory (CAM) bit having a first comparand line;
   a second CAM bit having a second comparand dataline;
   a third CAM bit having a third comparand dataline; and
   a fourth CAM bit having a fourth comparand dataline;
   wherein during a compare operation, one of the first, second, third, or fourth comparand dataline being asserted.

2. The structure of claim 1, wherein the first CAM bit stores a first encoded data.

3. The structure of claim 1, wherein the second CAM bit stores a second encoded data.

4. The structure of claim 1, wherein the third CAM bit stores a third encoded data.

5. The structure of claim 1, wherein the fourth CAM bit stores a fourth encoded data.

6. The structure of claim 1, further comprising a match line coupled to the first, second, third, and fourth CAM bits.

7. The structure of claim 1, wherein the first, second, third, and fourth CAM bits comprises at least one memory cell in a DRAM, SRAM, EPROM, PROM, ROM, or other type of storage element.

8. A method for generating a comparand dataline in a content addressable memory (CAM), comprising the steps of:

in a twin ternary cell:
    encoding a first comparand dataline representing a first state in a first CAM bit;
    encoding a second comparand dataline representing a second state in a second CAM bit;
    encoding a third comparand dataline representing a third state in a third CAM bit;
    encoding a fourth comparand dataline representing a fourth state in a fourth CAM bit; and
    during a compare operation, asserting one of the encoded first, second, third, or fourth comparand dataline.

9. The method of claim 8, wherein during the compare operation, comprises the step of deasserting the other three encoded comparand datalines that are not selected to be asserted.

10. The method of claim 8, wherein during the compare operation, comprises the step of drawing power or electrical current only from the asserted encoded comparand dataline.

11. The method of claim 9, wherein during the compare operation, comprises the step of not drawing any power or electrical current from the three comparand datalines that are not asserted.

12. The method of claim 8, further comprising the step of storing a first encoded data in the first CAM bit.

13. The method of claim 8, further comprising the step of storing a second encoded data in the second CAM bit.

14. The method of claim 8, further comprising the step of storing a third encoded data in the third CAM bit.

15. Method of claim 8, further comprising the step of storing a fourth encoded data in the fourth CAM bit.

16. The method of claim 8, further comprising the step of generating a match signal from the twin ternary cell.

17. A structure, comprising:

a twin ternary cell, comprising:
    a first content addressable memory (CAM) bit having a first comparand dataline;
    a second CAM bit having a second comparand dataline;
    a third CAM bit having a third comparand dataline; and
    a fourth CAM bit having a fourth comparand dataline;
      wherein during a compare operation, the first, second, third, and fourth comparand datalines are globally masked thereby none of the first, second, third, or fourth CAM bit is turned ON.

* * * * *